(12) United States Patent
Tsai et al.

(10) Patent No.: US 10,574,095 B2
(45) Date of Patent: Feb. 25, 2020

(54) DECODING METHOD FOR SIGNAL PROCESSING CIRCUIT AND SIGNAL PROCESSING CIRCUIT USING THE SAME

(71) Applicant: Fu Da Tong Technology Co., Ltd., New Taipei (TW)

(72) Inventors: Ming-Chiu Tsai, New Taipei (TW); Chi-Che Chan, New Taipei (TW)

(73) Assignee: Fu Da Tong Technology Co., Ltd., New Taipei (TW)

( * ) Notice: Subject to any disclaimer, the term of this patent is extended or adjusted under 35 U.S.C. 154(b) by 0 days.

(21) Appl. No.: 16/241,940

(22) Filed: Jan. 7, 2019

(65) Prior Publication Data

US 2019/0140491 A1    May 9, 2019

Related U.S. Application Data

(63) Continuation-in-part of application No. 15/197,796, filed on Jun. 30, 2016, now Pat. No. 10,312,748.
(Continued)

(30) Foreign Application Priority Data

Feb. 1, 2011  (TW) .............................. 100103836 A
May 3, 2013  (TW) .............................. 102115983 A
(Continued)

(51) Int. Cl.
*H02J 50/12*  (2016.01)
*H02J 50/80*  (2016.01)
(Continued)

(52) U.S. Cl.
CPC .............. *H02J 50/80* (2016.02); *H02J 50/12* (2016.02); *H04B 5/0031* (2013.01); *H04B 5/0081* (2013.01); *H04B 15/00* (2013.01)

(58) Field of Classification Search
USPC ........................................................ 307/104
See application file for complete search history.

(56) References Cited

U.S. PATENT DOCUMENTS

| 3,573,817 A | 4/1971 | Akers |
| 4,393,516 A | 7/1983 | Itani |

(Continued)

FOREIGN PATENT DOCUMENTS

| CN | 101399464 A | 4/2009 |
| CN | 102904475 A | 1/2013 |

(Continued)

OTHER PUBLICATIONS

Ma et al., Analysis of metal foreign object setting on electric vehicle wireless power transfer system, <Advanced Technology of Electrical Engineering and Energy> vol. 36, No. 2, p. 14-20 , Feb. 28, 2017.

*Primary Examiner* — Rexford N Barnie
*Assistant Examiner* — Xuan Ly
(74) *Attorney, Agent, or Firm* — Winston Hsu (57) ABSTRACT

A decoding method for a signal processing circuit which receives a modulation data carried by a coil signal includes the following steps: determining a jitter in the coil signal; obtaining a trigger gap when the jitter appears; outputting a gap indicating signal when a length of the trigger gap is within a predefined range; determining whether a plurality of gap indicating signals appear in a first period and whether the gap indicating signals are scattered in the first period; setting a flag to a jitter status according to the above determination results; determining whether the flag is set to the jitter status during a second period, and filling a value in a time slot corresponding to the second period accordingly; and obtaining a data code of the modulation data according to the values filled in a plurality of time slots.

20 Claims, 7 Drawing Sheets

Related U.S. Application Data which is a continuation-in-part of application No. 14/822,875, filed on Aug. 10, 2015, now Pat. No. 9,960,639, and a continuation-in-part of application No. 14/731,421, filed on Jun. 5, 2015, now Pat. No. 10,038,338, which is a continuation-in-part of application No. 13/541,090, filed on Jul. 3, 2012, now Pat. No. 9,075,587, and a continuation-in-part of application No. 14/017,321, filed on Sep. 4, 2013, now Pat. No. 9,628,147, and a continuation-in-part of application No. 13/212,564, filed on Aug. 18, 2011, now Pat. No. 8,941,267, which is a continuation-in-part of application No. 13/154,965, filed on Jun. 7, 2011, now Pat. No. 8,810,072, said application No. 14/017,321 is a continuation-in-part of application No. 13/541,090, filed on Jul. 3, 2012, now Pat. No. 9,075,587, said application No. 15/197,796 is a continuation-in-part of application No. 14/876,788, filed on Oct. 6, 2015, now Pat. No. 9,831,687, which is a continuation-in-part of application No. 14/017,321, filed on Sep. 4, 2013, now Pat. No. 9,628,147.

(30) Foreign Application Priority Data

| Jan. 14, 2015 | (TW) | 104101227 A |
|---|---|---|
| Jun. 2, 2015 | (TW) | 104117722 A |
| Jun. 30, 2015 | (TW) | 104121025 A |
| Apr. 14, 2016 | (TW) | 105111620 A |

(51) Int. Cl.
  *H04B 15/00* (2006.01)
  *H04B 5/00* (2006.01)

(56) References Cited

U.S. PATENT DOCUMENTS

| 5,270,998 | A | 12/1993 | Uchiumi |
|---|---|---|---|
| 7,720,452 | B2 | 5/2010 | Miyahara |
| 7,939,963 | B2 | 5/2011 | Chang |
| 8,072,310 | B1 | 12/2011 | Everhart |
| 8,422,420 | B1 | 4/2013 | Gulasekaran |
| 8,731,116 | B2 | 5/2014 | Norconk |
| 9,048,881 | B2 | 6/2015 | Tsai |
| 9,075,587 | B2 | 7/2015 | Tsai |
| 9,553,485 | B2 | 1/2017 | Singh |
| 9,995,777 | B2 | 6/2018 | Von Novak, III |
| 10,056,944 | B2 | 8/2018 | Tsai |
| 10,122,220 | B2 | 11/2018 | Sankar |
| 2003/0123168 | A1 | 7/2003 | Yokomizo |
| 2005/0076102 | A1 | 4/2005 | Chen |
| 2005/0258826 | A1 | 11/2005 | Kano |
| 2008/0030398 | A1 | 2/2008 | Nakamura |
| 2008/0106273 | A1 | 5/2008 | Bauer |
| 2009/0026844 | A1* | 1/2009 | Iisaka ............ H02J 7/025 307/104 |
| 2009/0167300 | A1 | 7/2009 | Cech |
| 2009/0271048 | A1 | 10/2009 | Wakamatsu |
| 2009/0278651 | A1 | 11/2009 | Okada |
| 2009/0284082 | A1 | 11/2009 | Mohammadian |
| 2009/0302800 | A1 | 12/2009 | Shiozaki |
| 2009/0319212 | A1 | 12/2009 | Cech |
| 2010/0098177 | A1 | 4/2010 | Hamaguchi |
| 2010/0213590 | A1 | 8/2010 | Warren |
| 2010/0225173 | A1 | 9/2010 | Aoyama |
| 2010/0237943 | A1 | 9/2010 | Kim |
| 2010/0270867 | A1 | 10/2010 | Abe |
| 2011/0062793 | A1 | 3/2011 | Azancot |
| 2011/0097996 | A1 | 4/2011 | Kalanithi |
| 2011/0196544 | A1 | 8/2011 | Baarman |
| 2011/0241436 | A1 | 10/2011 | Furukawa |
| 2012/0153739 | A1 | 6/2012 | Cooper |
| 2012/0169132 | A1 | 7/2012 | Choudhary |
| 2012/0293009 | A1 | 11/2012 | Kim |
| 2013/0015705 | A1 | 1/2013 | Abe |
| 2013/0049484 | A1 | 2/2013 | Weissentern |
| 2013/0057079 | A1 | 3/2013 | Park |
| 2013/0065518 | A1 | 3/2013 | Byun |
| 2013/0082653 | A1 | 4/2013 | Lee |
| 2013/0106197 | A1 | 5/2013 | Bae |
| 2013/0162054 | A1 | 6/2013 | Komiyama |
| 2013/0162204 | A1 | 6/2013 | Jung |
| 2013/0175873 | A1 | 7/2013 | Kwon |
| 2013/0175937 | A1 | 7/2013 | Nakajo |
| 2013/0176023 | A1 | 7/2013 | Komiyama |
| 2013/0187476 | A1 | 7/2013 | Tsal |
| 2013/0267213 | A1 | 10/2013 | Hsu |
| 2013/0342027 | A1 | 12/2013 | Tsai |
| 2014/0015329 | A1 | 1/2014 | Widmer |
| 2014/0024919 | A1 | 1/2014 | Metzenthen |
| 2014/0077616 | A1 | 3/2014 | Baarman |
| 2014/0084857 | A1 | 3/2014 | Liu |
| 2014/0152251 | A1 | 6/2014 | Kim |
| 2014/0184152 | A1 | 7/2014 | Van Der Lee |
| 2014/0355314 | A1 | 12/2014 | Ryan |
| 2015/0008756 | A1 | 1/2015 | Lee |
| 2015/0028875 | A1 | 1/2015 | Irie |
| 2015/0044966 | A1 | 2/2015 | Shultz |
| 2015/0054355 | A1 | 2/2015 | Ben-Shalom |
| 2015/0123602 | A1 | 5/2015 | Patino |
| 2015/0162054 | A1 | 6/2015 | Ishizu |
| 2015/0162785 | A1 | 6/2015 | Lee |
| 2015/0180286 | A1 | 6/2015 | Asanuma |
| 2015/0263531 | A1 | 9/2015 | Kozakai |
| 2015/0285926 | A1 | 10/2015 | Oettinger |
| 2015/0372493 | A1 | 12/2015 | Sankar |
| 2016/0064951 | A1 | 3/2016 | Yamamoto |
| 2016/0064952 | A1 | 3/2016 | Matsumoto |
| 2016/0072336 | A1 | 3/2016 | Tamino |
| 2016/0241086 | A1 | 8/2016 | Jung |
| 2016/0349782 | A1 | 12/2016 | Tsai |
| 2018/0034281 | A1 | 2/2018 | Tsai |
| 2018/0138756 | A1 | 5/2018 | Bae |
| 2018/0241257 | A1 | 8/2018 | Muratov |

FOREIGN PATENT DOCUMENTS

| CN | 104160300 A | 11/2014 |
|---|---|---|
| CN | 204190475 U | 3/2015 |
| CN | 105027387 A | 11/2015 |
| CN | 105308829 A | 2/2016 |
| CN | 106094041 A | 11/2016 |
| CN | 106134037 A | 11/2016 |
| CN | 106560730 A | 4/2017 |
| CN | 106685029 A | 5/2017 |
| CN | 107615612 A | 1/2018 |
| EP | 3 160 008 A1 | 4/2017 |
| JP | 2016-75484 A | 5/2016 |
| TW | 201315082 A1 | 4/2013 |
| TW | 201417445 A | 5/2014 |
| TW | 201513523 A | 4/2015 |
| TW | 201605143 A | 2/2016 |
| TW | 201631862 A | 9/2016 |
| WO | 2016/159788 A1 | 10/2016 |
| WO | 2016/181658 A1 | 11/2016 |

\* cited by examiner

Comparator-triggered status queue buffer

0101010101010101 ← CP1

1111111111111111 ← CP2

⇩

Gap status queue buffer

Comparator-triggered status queue buffer

0101010101010000 ← CP1

1111111111111000 ← CP2

⇩

Gap status queue buffer

| Time(ms) | Number | Start bit | Bit 0 | Bit 1 | Parity check code 0 | Parity check code 1 | Time slots may be filled with "1" |
|---|---|---|---|---|---|---|---|
| 0.00 | 0 | ▨ | | | | | ▨ |
| 0.25 | 1 | | | | | | |
| 0.50 | 2 | | | | | | |
| 0.75 | 3 | | | | | | |
| 1.00 | 4 | | | | | | |
| 1.25 | 5 | | | | | | |
| 1.50 | 6 | | | | | | |
| 1.75 | 7 | | | | | | |
| 2.00 | 8 | | | | | | |
| 2.25 | 9 | | | | | | |
| 2.50 | 10 | ▨ | | | | | ▨ |
| 2.75 | 11 | | | | | | |
| 3.00 | 12 | | | | | | |
| 3.25 | 13 | | | | | | |
| 3.50 | 14 | | | | | | |
| 3.75 | 15 | | | | | | |
| 4.00 | 16 | | | | | | |
| 4.25 | 17 | | | | | | |
| 4.50 | 18 | | ▨ | | | | ▨ |
| 4.75 | 19 | | | | | | |
| 5.00 | 20 | | | | | | |
| 5.25 | 21 | | | | | | |
| 5.50 | 22 | | | ▨ | | | ▨ |
| 5.75 | 23 | | | | | | |
| 6.00 | 24 | | | | | | |
| 6.25 | 25 | | | | | | |
| 6.50 | 26 | | ▨ | | | | ▨ |
| 6.75 | 27 | | | | | | |
| 7.00 | 28 | | | | | | |
| 7.25 | 29 | | | | | | |
| 7.50 | 30 | | ▨ | ▨ | | | ▨ |
| 7.75 | 31 | | | | | | |

DECODING METHOD FOR SIGNAL PROCESSING CIRCUIT AND SIGNAL PROCESSING CIRCUIT USING THE SAME

CROSS REFERENCE TO RELATED APPLICATIONS

This application is a continuation-in-part application of U.S. application Ser. No. 15/197,796, filed on Jun. 30, 2016.

U.S. application Ser. No. 15/197,796 is further a continuation-in-part application of U.S. application Ser. No. 14/822,875, filed on Aug. 10, 2015, a continuation-in-part application of U.S. application Ser. No. 14/731,421, filed on Jun. 5, 2015, and a continuation-in-part application of U.S. application Ser. No. 14/876,788, filed on Oct. 6, 2015.

U.S. application Ser. No. 14/731,421 is further a continuation-in-part application of U.S. application Ser. No. 14/017,321, filed on Sep. 4, 2013, and a continuation-in-part application of U.S. application Ser. No. 13/541,090, filed on Jul. 3, 2012.

U.S. application Ser. No. 14/017,321 is further a continuation-in-part application of U.S. application Ser. No. 13/541,090, filed on Jul. 3, 2012, and a continuation-in-part application of U.S. application Ser. No. 13/212,564, filed on Aug. 18, 2011.

U.S. application Ser. No. 13/212,564 is further a continuation-in-part application of U.S. application Ser. No. 13/154,965, filed on Jun. 7, 2011.

U.S. application Ser. No. 14/876,788 is further a continuation-in-part application of U.S. application Ser. No. 14/017,321, filed on Sep. 4, 2013.

The contents of these applications are incorporated herein by reference.

BACKGROUND OF THE INVENTION

1. Field of the Invention

The present invention relates to a decoding method, and more particularly, to a decoding method applicable to a signal processing circuit of an induction type power supply system.

2. Description of the Prior Art

For safety purposes, a power supply device of an induction type power supply system has to ensure that a proper power receiving device is positioned on the sensing area of a supplying-end coil of the power supply device and that the power receiving device is ready to receive power before the power is supplied. In order to allow the power supply device to confirm the above conditions, data codes should be transmitted for identification purposes. The data code transmission is that, the power supply device drives the supplying-end coil to generate resonance and send electromagnetic power to the power receiving device for power delivery. When the power receiving device receives the power, the power receiving device may change the impedance on the receiving-end coil via the signal modulation technology, and the variations are fed back to vary the resonant carrier signals on the supplying-end coil, so as to deliver the data codes.

In the above induction type power supply system, the data codes are forwarded between the supplying-end coil and the receiving-end coil; hence, transmissions of the data codes are always accompanied by power delivery in different magnitudes, such that the data codes received by the supplying-end device are easily interfered with by power noises. Therefore, how to effectively read the data codes under noise interferences with different magnitudes has become an important objective that the industry makes its efforts to achieve.

SUMMARY OF THE INVENTION

It is therefore an objective of the present invention to provide a decoding method applicable to a signal processing circuit of an induction type power supply system, to effectively obtain a data code corresponding to the coil signal while excluding the interferences of power noises or other noises.

An embodiment of the present invention discloses a decoding method for a signal processing circuit. The signal processing circuit receives a modulation data carried by a coil signal. The decoding method comprises: receiving the coil signal and determining a jitter in the coil signal; obtaining a trigger gap when the jitter appears in a peak location of a plurality of peaks in the coil signal; determining a length of the trigger gap, and outputting a gap indicating signal when the length of the trigger gap is within a predefined range; determining whether a plurality of gap indicating signals appear in a first period, and determining whether the plurality of gap indicating signals are scattered in the first period; setting a flag to a jitter status according to determination results of whether the plurality of gap indicating signals appear in the first period and whether the plurality of gap indicating signals are scattered in the first period; determining whether the flag is set to the jitter status during a second period, and accordingly filling a value in a time slot corresponding to the second period among a plurality of time slots for determining the modulation data; and obtaining a data code of the modulation data according to a plurality of values filled in the plurality of time slots.

Another embodiment of the present invention discloses a signal processing circuit for receiving a modulation data carried by a coil signal and decoding the modulation data. The signal processing circuit comprises at least one comparator module and a processor. The at least one comparator module is configured to receive the coil signal and determine a jitter in the coil signal. The processor, coupled to the comparator module, is configured to perform the following steps: obtaining a trigger gap when the jitter appears in a peak location of a plurality of peaks in the coil signal; determining a length of the trigger gap, and outputting a gap indicating signal when the length of the trigger gap is within a predefined range; determining whether a plurality of gap indicating signals appear in a first period, and determining whether the plurality of gap indicating signals are scattered in the first period; setting a flag to a jitter status according to determination results of whether the plurality of gap indicating signals appear in the first period and whether the plurality of gap indicating signals are scattered in the first period; determining whether the flag is set to the jitter status during a second period, and accordingly filling a value in a time slot corresponding to the second period among a plurality of time slots for determining the modulation data; and obtaining a data code of the modulation data according to a plurality of values filled in the plurality of time slots.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
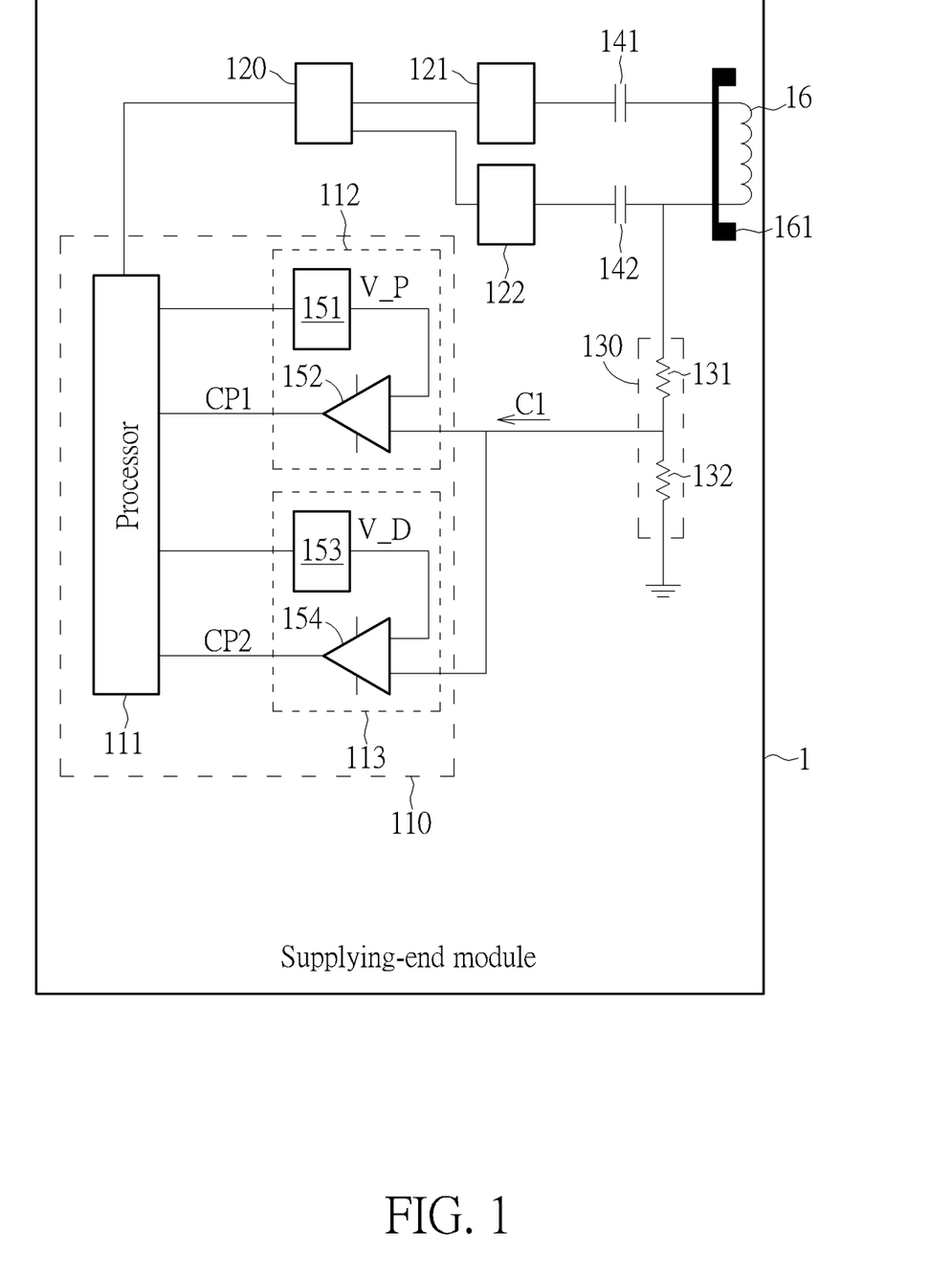
FIG. 1 is a schematic diagram of a supplying-end module according to an embodiment of the present invention.

Please refer to FIG. 1, which is a schematic diagram of a supplying-end module 1 according to an embodiment of the present invention. The supplying-end module 1 is applicable to an induction type power supply system, for sending electric power to a receiving-end module of the induction type power supply system and receiving modulation data from the receiving-end module. The modulation data have functions of informing of the power supply status and power adjustment, etc. The supplying-end module 1 includes a supplying-end coil 16 and resonant capacitors 141 and 142. The supplying-end coil 16 is used for delivering electromagnetic energies to the receiving-end module to supply power. The resonant capacitors 141 and 142, coupled to the supplying-end coil 16, are used for performing resonance together with the supplying-end coil 16 during power supply. In addition, in the supplying-end module 1, a magnetic conductor 161 composed of magnetic materials may be selectively disposed, to enhance the electromagnetic induction capability of the supplying-end coil 16 and also prevent electromagnetic energies from affecting the objects located in the non-inducting side of the coil.

In order to control the operations of the supplying-end coil 16 and the resonant capacitors 141 and 142, the supplying-end module 1 further includes a clock generator 120, power driver units 121 and 122, a signal processing circuit 110 and a voltage dividing circuit 130. The clock generator 120 and the power driver units 121 and 122 are used for driving the supplying-end coil 16 to deliver power, and the detailed operations related to these modules should be well known by those skilled in the art and will not be narrated herein. The voltage dividing circuit 130, which includes voltage dividing resistors 131 and 132, may attenuate the coil signal C1 on the supplying-end coil 16 and then output the coil signal C1 to the signal processing circuit 110. In some embodiments, if the endurance voltage of the signal processing circuit 110 is high enough, the voltage dividing circuit 130 may not be disposed and the signal processing circuit 110 may directly receive the coil signal C1 from the supplying-end coil 16.

The signal processing circuit 110 may detect the modulation signals on the coil signal C1 and fetch the modulation data via a decoding scheme. In general, the supplying-end module 1 and its corresponding receiving-end module transmit data by a predetermined communication method. In an embodiment, coding is performed by using the length of time interval of the transmitted modulation signals, as will be detailed hereinafter. As shown in FIG. 1, the signal processing circuit 110 includes a processor 111 and comparator modules 112 and 113. Note that in some embodiments, the processor 111 is not only used for performing data interpretation, but also configured with functions of activating the power driver units 121 and 122 to output driving signals. Therefore, the processor 111 may also be disposed independent from the signal processing circuit 110, and is not limited herein.

Figure 2:
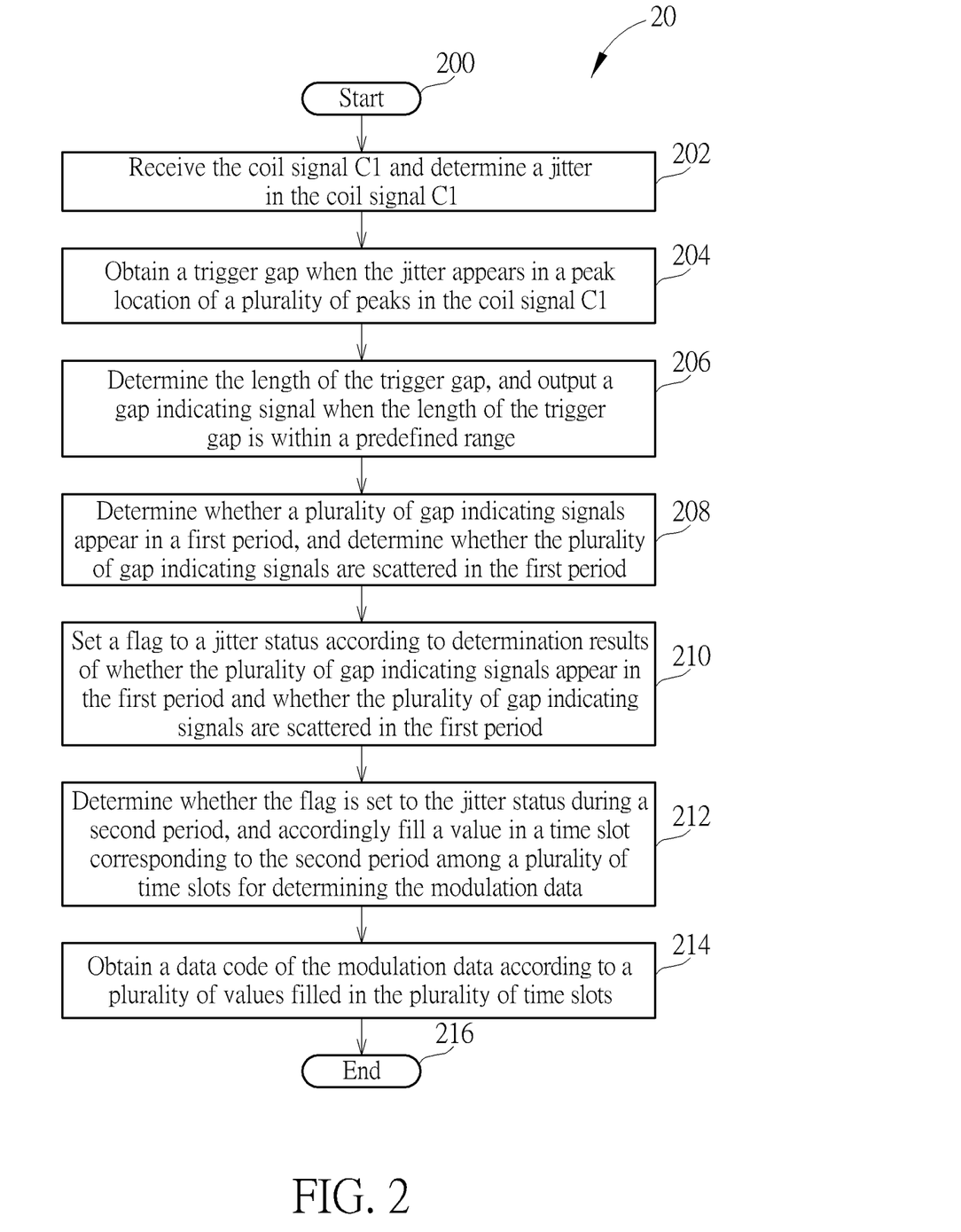
FIG. 2 is a schematic diagram of a decoding process according to an embodiment of the present invention.

Please refer to FIG. 2, which is a schematic diagram of a decoding process 20 according to an embodiment of the present invention. The decoding process 20 may be used for a signal processing circuit in a supplying-end module of an induction type power supply system, such as the signal processing circuit 110 shown in FIG. 1, for decoding the modulation data from the receiving-end device, where the modulation data are carried by the coil signal C1 and transmitted to the signal processing circuit 110. As shown in FIG. 2, the decoding process 20 includes the following steps:

Step 200: Start.

Step 202: Receive the coil signal C1 and determine a jitter in the coil signal C1.

Step 204: Obtain a trigger gap when the jitter appears in a peak location of a plurality of peaks in the coil signal C1.

Step 206: Determine the length of the trigger gap, and output a gap indicating signal when the length of the trigger gap is within a predefined range.

Step 208: Determine whether a plurality of gap indicating signals appear in a first period, and determine whether the plurality of gap indicating signals are scattered in the first period.

Step 210: Set a flag to a jitter status according to determination results of whether the plurality of gap indicating signals appear in the first period and whether the plurality of gap indicating signals are scattered in the first period.

Step 212: Determine whether the flag is set to the jitter status during a second period, and accordingly fill a value in a time slot corresponding to the second period among a plurality of time slots for determining the modulation data.

Step 214: Obtain a data code of the modulation data according to a plurality of values filled in the plurality of time slots.

Step 216: End.

Figure 3:
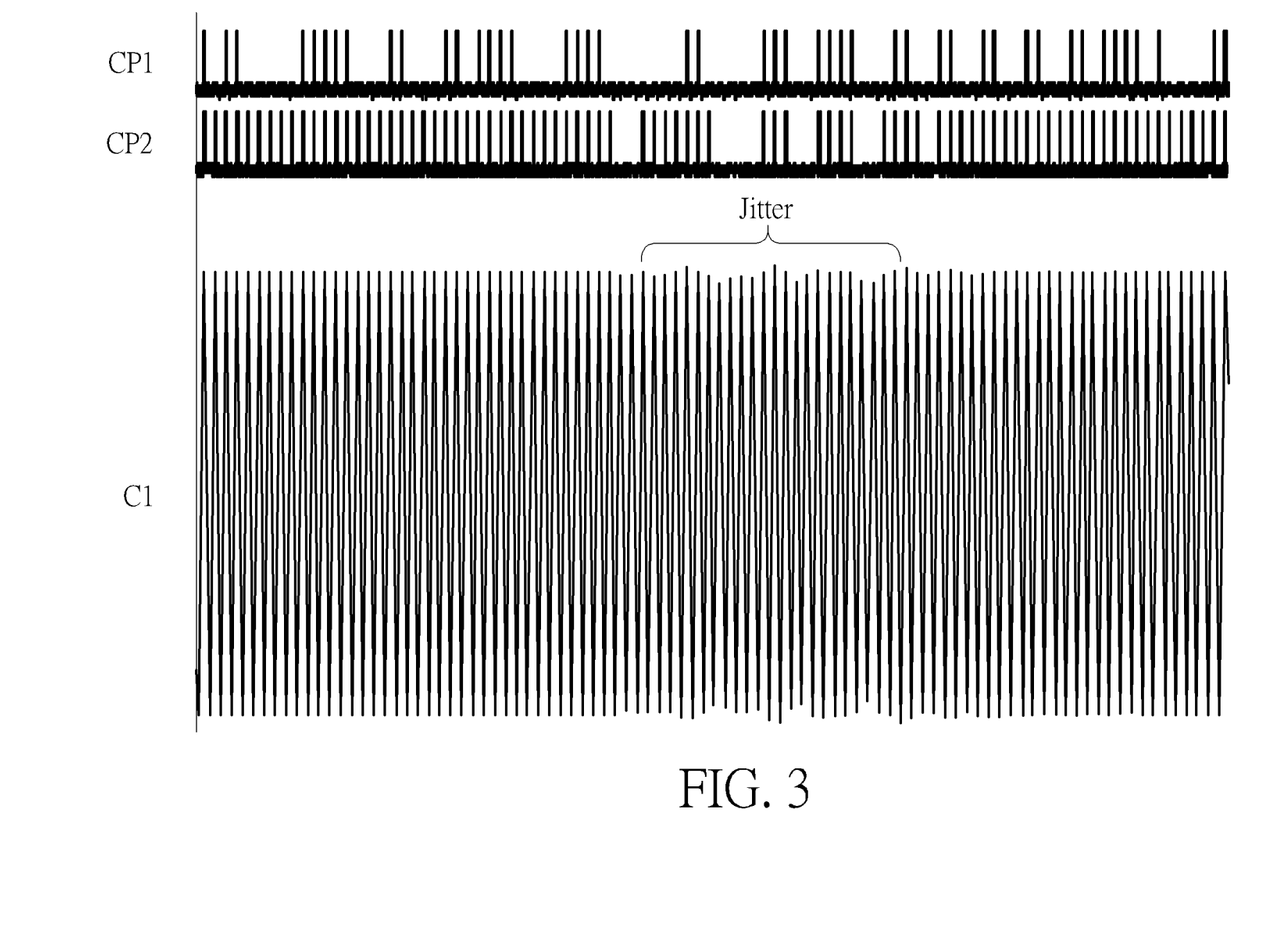
FIG. 3 is a schematic diagram of determining the jitter to obtain the trigger gap according to an embodiment of the present invention.

According to the decoding process 20, the signal processing circuit 110 first determines a jitter in the coil signal C1 (Step 202), in order to obtain a trigger gap (Step 204). In detail, please refer to FIG. 3, which is a schematic diagram of determining the jitter to obtain the trigger gap according to an embodiment of the present invention. FIG. 3 illustrates the coil signal C1, a comparison result CP1 of the comparator module 112 and a comparison result CP2 of the comparator module 113. In detail, the comparator module 112 or 113 is composed of a comparator and a voltage generation unit. The comparator module 112 includes a voltage generation unit 151 and a comparator 152, and the comparator module 113 includes a voltage generation unit 153 and a comparator 154. The comparator module 112 is used for tracking the peak voltages of a plurality of peaks in the coil signal C1. In detail, the processor 111 may output a setting data to the comparator module 112, to control the voltage generation unit 151 to generate a peak voltage level V_P, so that the comparator 152 is able to compare the peak voltage level V_P with the coil signal C1. In a coil oscillation cycle, when the peak height of the coil signal C1 exceeds the peak voltage level V_P, a pulse signal appears in the comparison result CP1 outputted by the comparator 152 (i.e., a trigger occurs). In such a situation, the processor 111 changes the setting data provided for the voltage generation unit 151 to increase the peak voltage level V_P; in a coil oscillation cycle, when the peak height of the coil signal C1 is lower than the peak voltage level V_P, the comparison result CP1 of the comparator 152 continuously outputs a low voltage level (i.e., no trigger occurs). In such a situation, the processor 111 changes the setting data provided for the voltage generation unit 151 to decrease the peak voltage level V_P. By the above method, the peak voltage level V_P may keep tracking the peak voltages of the coil signal C1, and the comparison result CP1 appears to be sometimes triggered and sometimes not triggered, as shown in FIG. 3.

Subsequently, the processor 111 may decrease the peak voltage level V_P by a predetermined value to obtain a determination voltage level V_D, and output related setting data to the voltage generation unit 153 of the comparator module 113 to control the voltage generation unit 153 to generate the determination voltage level V_D, so that the comparator 154 may compare the determination voltage level V_D with the coil signal C1. Under normal oscillations in general, the peak voltage level V_P keeps tracking the peak voltages of the coil signal C1, and thus the determination voltage level V_D continuously falls below the peak voltages of the coil signal C1. In such a situation, a trigger occurs in the comparison result CP2 in each coil oscillation cycle. However, when the modulation signals or data are received such that the coil signal C1 has jitter, the peak voltages may undergo a significant falling. If a peak voltage falls to be smaller than the determination voltage level V_D, a trigger gap may appear in the comparison result CP2 corresponding to the peak location where the jitter appears; that is, there is no trigger signal in one or more coil oscillation cycles due to the jitter, as shown in FIG. 3.

The processor 111 may further determine the length of the trigger gap, i.e., the number of continuous oscillation cycles without a trigger signal. In general, reception of the modulation signal/data may only generate a momentary fluctuation in the peak values of the coil signal C1, so that the length of the trigger gap falls within a specific range. An excessively long trigger gap may be generated from variations of the output power of coil or the loads, and an excessively short trigger gap may be generated from noise interferences. In such a situation, the processor 111 may set a predefined range, and determine whether the length of the trigger gap is within the predefined range in each coil oscillation cycle. For example, the processor 111 may set a range of 3-5, and output a gap indicating signal when the length of the trigger gap is greater than or equal to three coil oscillation cycles and smaller than or equal to five coil oscillation cycles (i.e., there is no trigger in the comparison result CP2 in 3-5 continuous coil oscillation cycles) (Step 206).

Figure 4A:
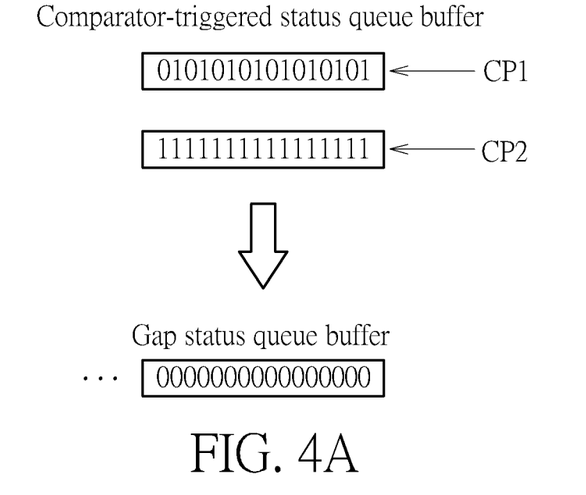
FIGS. 4A and 4B are schematic diagrams of using a queue buffer to record the jitters and trigger gaps according to an embodiment of the present invention.
Figure 4B:
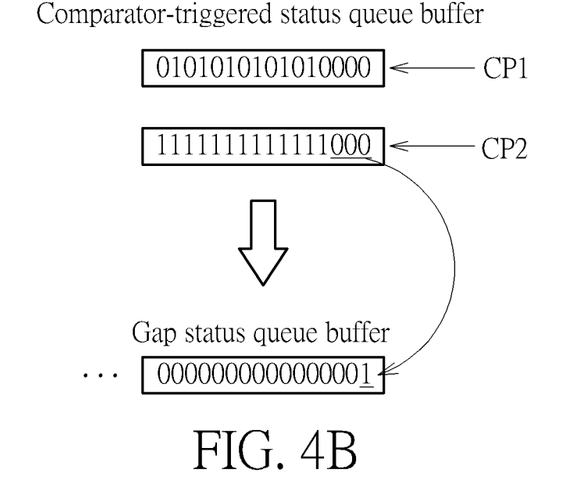

In an embodiment, the processor 111 may record the statuses of jitters and trigger gaps with a queue buffer. The queue buffer may update its values in each coil oscillation cycle. For example, the latest value may enter the minimum bit of queue, every value originally stored in the queue may be shifted to the larger next bit in sequence, and the value in the maximum bit is removed from the queue. Please refer to FIGS. 4A and 4B, which are schematic diagrams of using a queue buffer to record the jitters and trigger gaps according to an embodiment of the present invention. A comparator-triggered status queue buffer is configured to record the comparison results CP1 and CP2 outputted by the comparator modules 112 and 113, wherein a trigger is marked as "1" and no-trigger is marked as "0". As shown in FIG. 4A, when no trigger gap exists, the buffer corresponding to the comparison result CP2 is continuously recorded as "1", so that the gap status queue buffer is continuously recorded as "0". FIG. 4B illustrates the existence of a trigger gap, where the minimum bits of the buffer corresponding to the comparison result CP2 has 3 consecutive "0"s, which means a trigger gap with length equal to 3. At this moment, this gap information may be transmitted to the gap status queue buffer, and a "1" is recorded as a gap indicating signal. In other words, for each coil oscillation cycle, starting from the minimum bit of the comparator-triggered status queue buffer, the processor 111 may determine the number of consecutive "0"s. If the number is within the predefined range, the processor 111 may convert it into the gap indicating signal and output the gap indicating signal to the gap status queue buffer. Taking FIG. 4B as an example, if there is still no trigger in the comparison result CP2 in the next coil oscillation cycle, the corresponding buffer data may be "0". At this moment, a trigger gap with length equal to 4 appears in the minimum bits. The processor 111 determines that the length of this trigger gap is within the predefined range, and thereby records a "1" in the gap status queue buffer. In this embodiment, the "1" recorded in the gap status queue buffer means the existence of a trigger gap, the "0" recorded in the gap status queue buffer means there is no trigger gap or the length of the trigger gap is too long or too short. In each coil oscillation cycle, the values in the comparator-triggered status queue buffer and the gap status queue buffer are continuously updated, and the queues may indicate the status of trigger gaps during a period of time.

By the above method, the processor 111 may record the status of trigger gaps during a specific period of time in the gap status queue buffer, to determine whether a plurality of gap indicating signals appear in the specific period of time. Also, the processor 111 may determine whether the plurality of gap indicating signals are scattered in the specific period of time (Step 208). In detail, the induction type power supply system of the present invention is a high-speed system, and thus the coil oscillation cycle is an extremely short period; that is, these queue buffers are updated rapidly. Therefore, an up-and-down jitter in the coil signal caused by the modulation signal should cross several or tens of coil oscillation cycles. Correspondingly, the coil signal should include multiple trigger gaps generated due to the falling of peak voltage, and the trigger gaps should be distributed within a longer period of time (e.g., several tens of coil oscillation cycles) rather than be concentrated on a single time point. In such a situation, the processor 111 needs to determine whether the gap indicating signals are scattered.

For example, the processor 111 may set a first period, of which the length is substantially equal to 16 coil oscillation cycles, and the first period corresponds to 16 consecutive data in the gap status queue buffer. Subsequently, the first period may be divided into a first sub-period and a second sub-period. For example, the first period may be divided into two equal parts, so that the first sub-period corresponds to 8 data in the first half part of the gap status queue buffer, and the second sub-period corresponds to 8 data in the second half part of the gap status queue buffer. Subsequently, the processor 111 may determine whether a gap indicating signal appears in the first sub-period, i.e., whether there is at least a "1" appearing in the 8 data in the first half part of the gap status queue buffer; and determine whether a gap indicating signal appears in the second sub-period, i.e., whether there is at least a "1" appearing in the 8 data in the second half part of the gap status queue buffer. When the gap indicating signals (i.e., the value "1") appear in both of the first sub-period and the second sub-period, the processor 111 may determine that the gap indicating signals are scattered in the first period. On the contrary, if there is only one sub-period having the gap indicating signals, the processor 111 may determine that the gap indicating signals are not scattered in the first period.

In another embodiment, the processor 111 may also perform determination on scatter of the gap indicating signals in other manners. For example, the length of the first period may be modified. In detail, the length of the first period may be set to be equal to 32 coil oscillation cycles and corresponding to 32 consecutive data in the gap status queue buffer. In such a situation, the processor 111 may determine the distribution of gap indicating signals according to 16 data in the first half part and 16 data in the second half part of the gap status queue buffer.

Further, when the processor 111 determines that the gap indicating signals appear in the first period and the gap indicating signals are scattered in the first period, the processor 111 may set a flag to a jitter status (Step 210). This flag is configured to indicate whether a jitter exists in the coil signal C1 during a period of time (e.g., a second period). In detail, the abovementioned jitter signals and trigger gaps are recorded with a determination cycle identical to the coil oscillation cycle, i.e., a new data is inputted in each coil oscillation cycle. However, the flag setting is a basis for subsequent decoding, and the cycle of its output signal is configured based on the coding cycle. In a power supply system with high-speed signal oscillations, the cycle length of outputting signals of the flag is always greater than the length of the above coil oscillation cycle. In an embodiment, the processor 111 may set a jitter signal queue buffer for recording the setting of the flag. According to the coding and decoding schemes, a new data is inputted to the jitter signal queue buffer in every 0.25 milliseconds (ms), for indicating whether a jitter occurs in the coil signal within this 0.25 ms period, which means that the length of the second period is equal to 0.25 ms. In other words, each bit in the jitter signal queue buffer may correspond to a time slot of 0.25 ms. If the flag is set to a jitter status in the corresponding 0.25 ms period, the time slot may be filled with the value "1"; and if the flag is not set in the corresponding 0.25 ms period, the time slot may be filled with the value "0" (Step 212).

Figure 5:
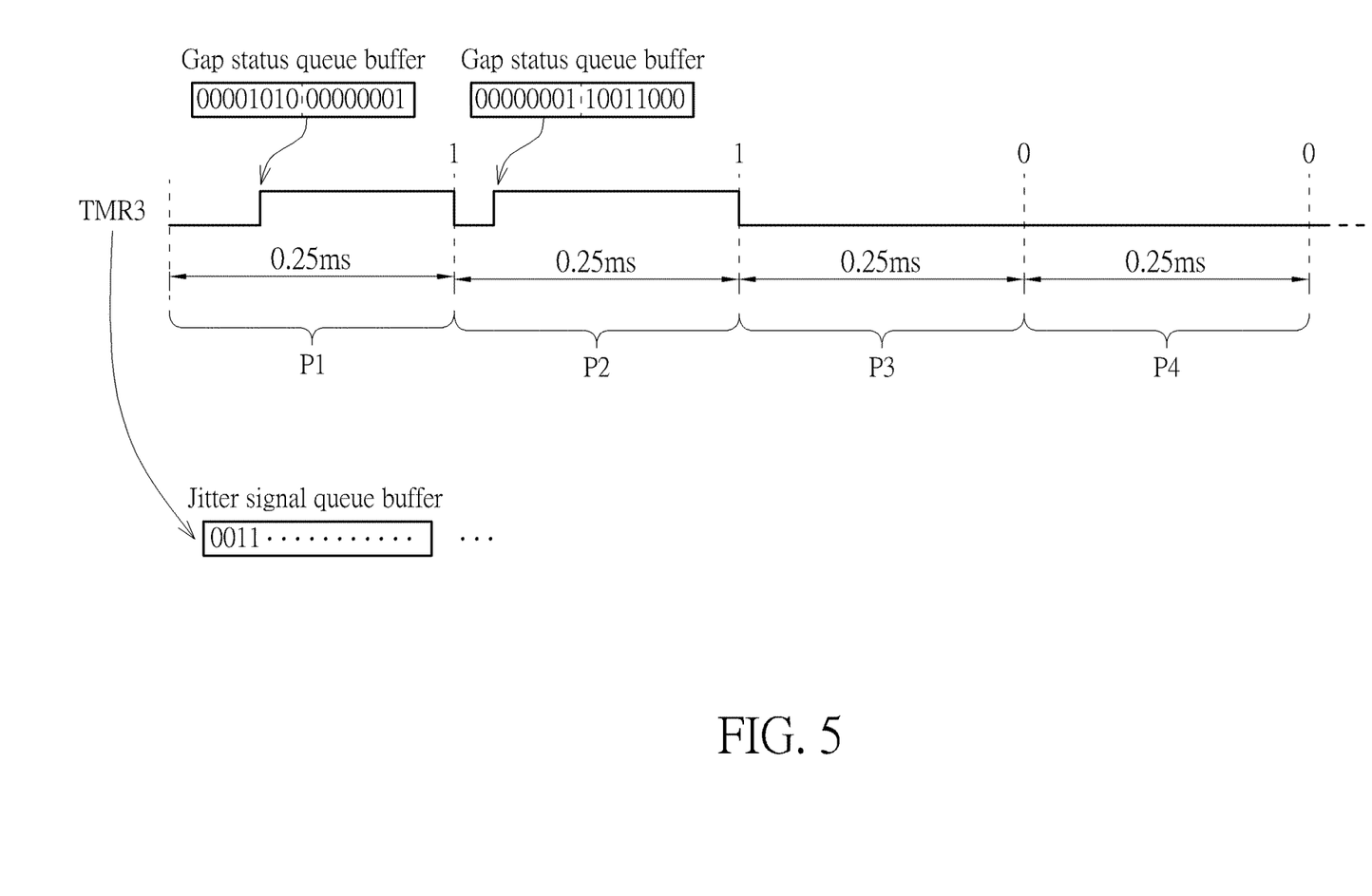
FIG. 5 is a schematic diagram of setting a flag and correspondingly writing a value into the jitter signal queue buffer according to an embodiment of the present invention.

Please refer to FIG. 5, which is a schematic diagram of setting a flag TMR3 and correspondingly writing a value into the jitter signal queue buffer according to an embodiment of the present invention. FIG. 5 illustrates 4 periods P1-P4 where jitter signals are determined, and the length of each period P1-P4 is equal to 0.25 ms. In this embodiment, the flag TMR3 may be denoted by a one-bit signal. The signal is in a low voltage level when the flag TMR3 is not set, and the set flag TMR3 is expressed by a high voltage level. During the period P1, since the data in the first half sub-period and the second half sub-period of the gap status queue buffer both include "1", the flag TMR3 is set to a jitter status (i.e., rising to the high voltage level). At the end of the period P1, the setting result of the flag TMR3 is written into the jitter signal queue buffer, i.e., the corresponding time slot is filled with a "1". Meanwhile, the setting of the flag TMR3 is cleared and the flag TMR3 is reset to the low voltage level for subsequent determination of jitter signals. Similarly, at the end of the period P2, since the flag TMR3 is set as indicating the jitter signal (i.e., rising to the high voltage level), the value "1" is filled in the corresponding time slot in the jitter signal queue buffer. Then, at the end of the periods P3 and P4, since the flag TMR3 is not set to the jitter status (i.e., remaining at the low voltage level) in these periods, the value "0" is filled in the corresponding time slots in the jitter signal queue buffer. In this embodiment, at the end of each period, the setting result of the flag TMR3 is written into the maximum bit of the jitter signal queue buffer. When a new data enters the jitter signal queue buffer, each value originally stored in the queue may be shifted to the smaller next bit in sequence, and the value in the minimum bit is removed from the queue. The writing method and the abovementioned writing methods for the comparator-triggered status queue buffer and the gap status queue buffer have opposite writing directions. Those skilled in the art may write values into a buffer in a preferable manner according to system requirements, and the above writing methods are alterable and should not be limited herein.

Please note that the flag TMR3 may be set to a jitter status as long as at least one "1" appears in both of the first half part and the second half part of the gap status queue buffer in any time point of each period P1-P4, until the setting of the flag TMR3 is cleared at the end of the period. During the time period after the flag TMR3 is set and before the setting is cleared, the flag TMR3 is still maintained at the set status of jitter signal no matter whether the situation that the value "1" appears in the first half part and the second half part of the gap status queue buffer occurs.

It should also be noted that, in the induction type power supply system of the present invention, the data cycle of the jitter signal queue buffer for decoding is 0.25 ms, which is a predetermined fixed time length and corresponding to the data cycle of coding performed by the receiving-end device. In comparison, the data cycle of each of the comparator-triggered status queue buffer and the gap status queue buffer mentioned above corresponds to a coil oscillation cycle. In general, the coil oscillation cycle may be deviated in response to load magnitudes and power level of the coil, and its operating frequency is approximately equal to 100 kHz, i.e., the cycle is approximately 0.01 ms. In such a situation, each time when a data is outputted to the jitter signal queue buffer, there are approximately 25 numbers of times the jitter signal is determined, but this determination number of times may still change based on variations of the coil oscillation cycle and/or the operating frequency.

In an embodiment, the processor 111 may know the time periods where the modulation signal/data may appear according to system configurations, and read data in the time periods. The reading of modulation data is suspended during other time periods to save computation resources. In an embodiment, according to a communication rule of the induction type power supply system, the receiving-end device transmits one byte of data codes in addition to a start bit and a parity check code every 50 ms, and the byte of data codes, the start bit and the parity check code may be received during a corresponding 50 ms period. In such a situation, in the 50 ms period, the operations of data reading may be suspended if the processor 111 determines that one data byte, a start bit and a parity check code are completely received, and then the processor 11 may start to read data at the beginning of the next 50 ms period.

In this embodiment, the bit data may be transmitted based on the timing as shown in Table 1:

TABLE 1

|  | Time length | Corresponding gap of time slots |
|---|---|---|
| Start bit | 2.5 ms | 10 |
| Bit 0 | 2 ms | 8 |
| Bit 1 | 3 ms | 12 |
| Parity check code 0 | 2.75 ms | 11 |
| Parity check code 1 | 3.25 ms | 13 |

As mentioned above, the data cycle of the jitter signal queue buffer is 0.25 ms, i.e., each time slot equals 0.25 ms; hence, the time lengths of different types of data codes have the correlations as shown in Table 1. In such a situation, for an entire data stream (including one byte of data, a start bit and a parity check code), the shortest time length may be 21.25 ms (including 8 bit 0 and a parity check code 0), and the longest time length may be 29.25 ms (including 8 bit 1 and a parity check code 0, where even parity check is applied for example). The processor 111 may obtain the data codes of modulation data according to the value filled in each time slot (Step 214). In detail, the processor 111 may fetch a first time slot filled with "1" and a second time slot filled with the next "1", and calculate the gap between the first time slot and the second time slot to determine whether the gap complies with a bit length of the data code, in order to obtain the data code according to the length of the gap. For example, when the gap of time slots is 8, the data code may be determined to be 0; when the gap of time slots is 12, the data code may be determined to be 1.

Figure 6:
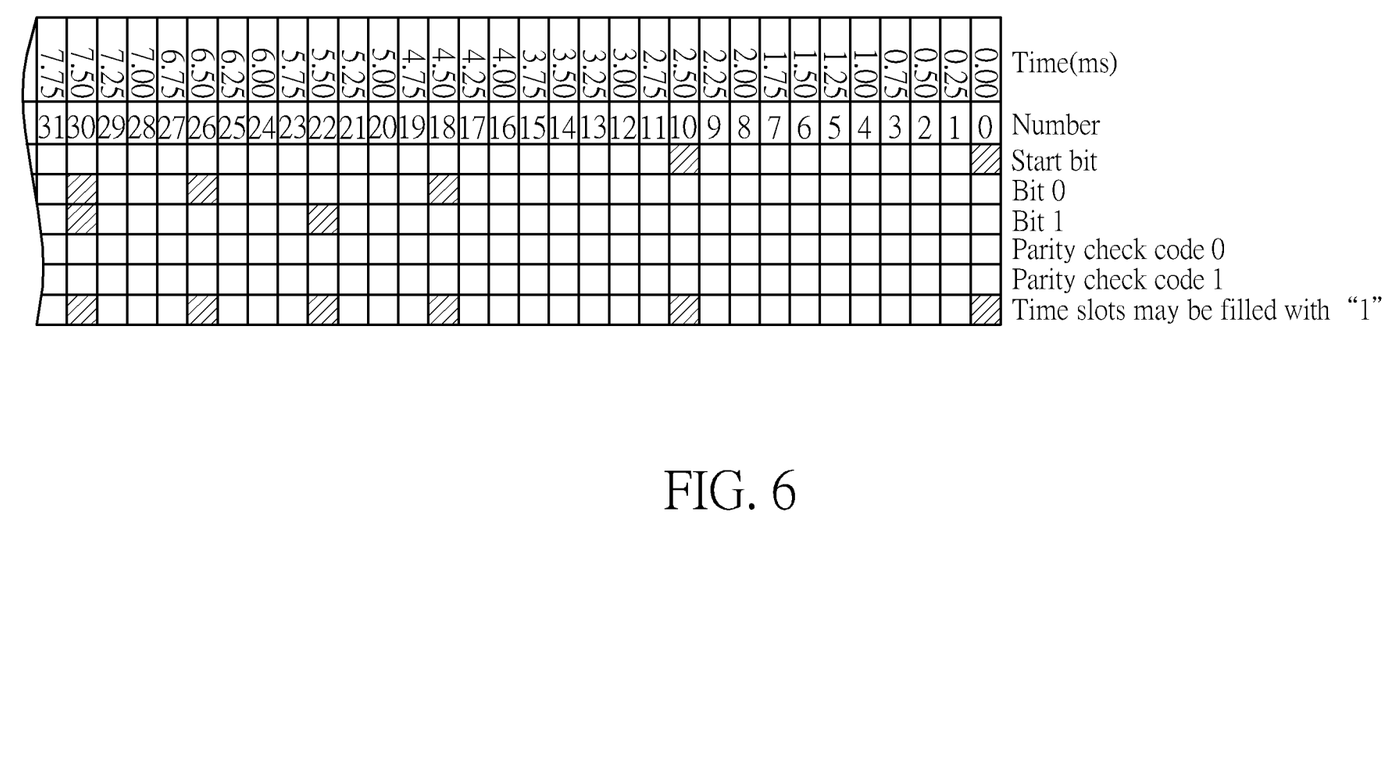
FIG. 6 is a schematic diagram of determining the start bit and the data codes based on the gap of time slots according to an embodiment of the present invention.

Please refer to FIG. 6, which is a schematic diagram of determining the start bit and the data codes based on the gap of time slots according to an embodiment of the present invention. As shown in FIG. 6, in each time slot, a value may be filled into the jitter signal queue buffer in sequence according to the flag TMR3, and the time slots are numbered from 0 to 31. First of all, the processor 111 determines whether a start bit occurs, i.e., whether the value "1" is filled in the time slot number 0 and the time slot number 10. For example, after a time slot is filled with the value "1", the processor 111 may determine whether a subsequent time slot after the 10-time-slot gap has the value "1". If yes, a start bit is determined to be received. The start bit may be used for determining whether the data codes start to be transmitted, and may also be used for defining the time correlations of the data codes. In other words, according to the positions of time slots where the start bit is received, the processor 111 may determine follow-up possible positions that may be filled with "1"s in the jitter signal queue buffer. Taking FIG. 6 as an example, the time slots number 0 and number 10 define the position of the start bit; hence, the time slot numbers 18, 22, 26 and 30 are those may be filled with "1"s. If the first data code is 0, the time slot number 18 has the value "1"; if the first data code is 1, the time slot number 22 has the value "1". In an embodiment, the processor 111 may fetch the value in every time slot to read the data codes. Alternatively, the processor 111 may only fetch the time slots that may be filled with "1" and/or their adjacent time slots to read the data codes, in order to save computation resources. The value "1" filled in other time slots may not comply with the coding mechanism, and should be a jitter caused by noises and thus may be omitted. Finally, the processor 111 may determine a parity check code according to the gap of time slots, so as to accomplish the determination of a group of modulation data.

Please note that the operations of finding a trigger gap via the comparator module to determine the jitter signal on the coil so as to write the information related to the jitter signal into the jitter signal queue buffer may not be satisfactory. For example, the receiving-end device may generate jitters lasting for a period of time on the supplying-end coil during modulation, and the corresponding jitter signals may have a time offset, such that a jitter signal may be shifted to appear in an earlier or later adjacent time slot. Alternatively, when the signal quality is more satisfactory, the lasting time of the jitter signals may become longer. Since the jitter signals are not synchronous to the detection cycles of time slots, it may also be possible that two adjacent time slots are both filled with the value "1". Therefore, the processor 111 may determine which time slots are possible to be filled with the value "1", and may also be configured to perform determination on the adjacent time slots, to take account of the situations of jitter offsets or extended jitters.

In an embodiment, the processor 111 may fetch the time slot numbers filled with the value "1", in consideration of those time slots possible to be filled with "1" and their adjacent time slots, and fill these time slot numbers into a jitter time slot series PIN, as shown in Table 2:

TABLE 2

| Jitter time slot series | | Jitter time slot GAP | |
|---|---|---|---|
| PIN_01 | 18 | GAP_01 | 8 |
| PIN_02 | 19 | GAP_02 | 1 |
| PIN_03 | 26 | GAP_03 | 7 |
| PIN_04 | 27 | GAP_04 | 1 |
| PIN_05 | 38 | GAP_05 | 11 |
| PIN_06 | 39 | GAP_06 | 1 |
| PIN_07 | 50 | GAP_07 | 11 |
| PIN_08 | 51 | GAP_08 | 1 |
| PIN_09 | 58 | GAP_09 | 7 |
| PIN_10 | 59 | GAP_10 | 1 |
| PIN_11 | 70 | GAP_11 | 11 |
| PIN_12 | 71 | GAP_12 | 1 |
| PIN_13 | 78 | GAP_13 | 7 |
| PIN_14 | 79 | GAP_14 | 1 |
| PIN_15 | 90 | GAP_15 | 11 |
| PIN_16 | 91 | GAP_16 | 1 |
| PIN_17 | 101 | GAP_17 | 10 |
| PIN_18 | 102 | GAP_18 | 1 |

In Table 2, the jitter time slot series PIN_01-PIN_18 stand for a series of time slot numbers in which the jitter signal is detected and thus the time slots are filled with the value "1". The above numbers follow the numbering method shown in FIG. 6 and include the follow-up extension of FIG. 6. The jitter time slot gaps GAP_01-GAP_18 record the gap between every two adjacent time slots among the jitter time slot series PIN_01-PIN_18, respectively. For example, GAP_01 records the gap between PIN_01 and the end of the start bit (i.e., the time slot number 10), GAP_02 records the gap between PIN_02 and PIN_01, GAP_03 records the gap between PIN_03 and PIN_02, and so on.

Subsequently, the processor 111 may perform decoding according to the values recorded in the jitter time slot gaps GAP_01-GAP_18. As mentioned above (see Table 1), the bit 0 and the bit 1 respectively correspond to the time slot gaps 8 and 12, and decoding may be performed accordingly. First, GAP_01 equals 8, which means that the first bit is 0. GAP_02 equals 1, which means that the first bit may cross to its adjacent time slot. Then, GAP_03 is determined to be equal to 7, in addition to the value crossed by the first bit, i.e., GAP_02+GAP_03=8; hence, the second bit is 0. GAP_04 equals 1, which means that the second bit may also cross to its adjacent time slot. Then, GAP_05 is determined to be equal to 11, in addition to the value crossed by the second bit, i.e., GAP_04+GAP_05=12; hence, the third bit is 1. By the same token, a byte of modulation data may be obtained as "00110101". Subsequently, the processor 111 may determine the parity check code. GAP_16 equals 1 and GAP_17 equals 10, i.e., GAP_16+GAP_17=11, which means that the parity check code is 0. According to even parity check applied in this coding example, this byte of data is accurate, and the processor 111 thereby receives this modulation data to perform follow-up processing. After receiving of the modulation data is accomplished, the processor 111 may clear the content of the jitter time slot series PIN_01-PIN_18 and the jitter time slot gap GAP_01-GAP_18 as mentioned above, which are then used for processing of subsequent data codes.

As can be seen, the bit 0 and the bit 1 may be specified to be corresponding to the time slot gaps 8 and 12, respectively, based on the coding rule. In addition, the time slot gaps 7 and 11 are allowable errors, and the accurate data codes may be obtained based on the abovementioned compensation method. In another embodiment, a time slot gap may appear to be equal to 9 or 13, which may also be adjusted to the time slot gap 8 or 12 according to a similar method, so as to determine the data codes.

Figure 7:
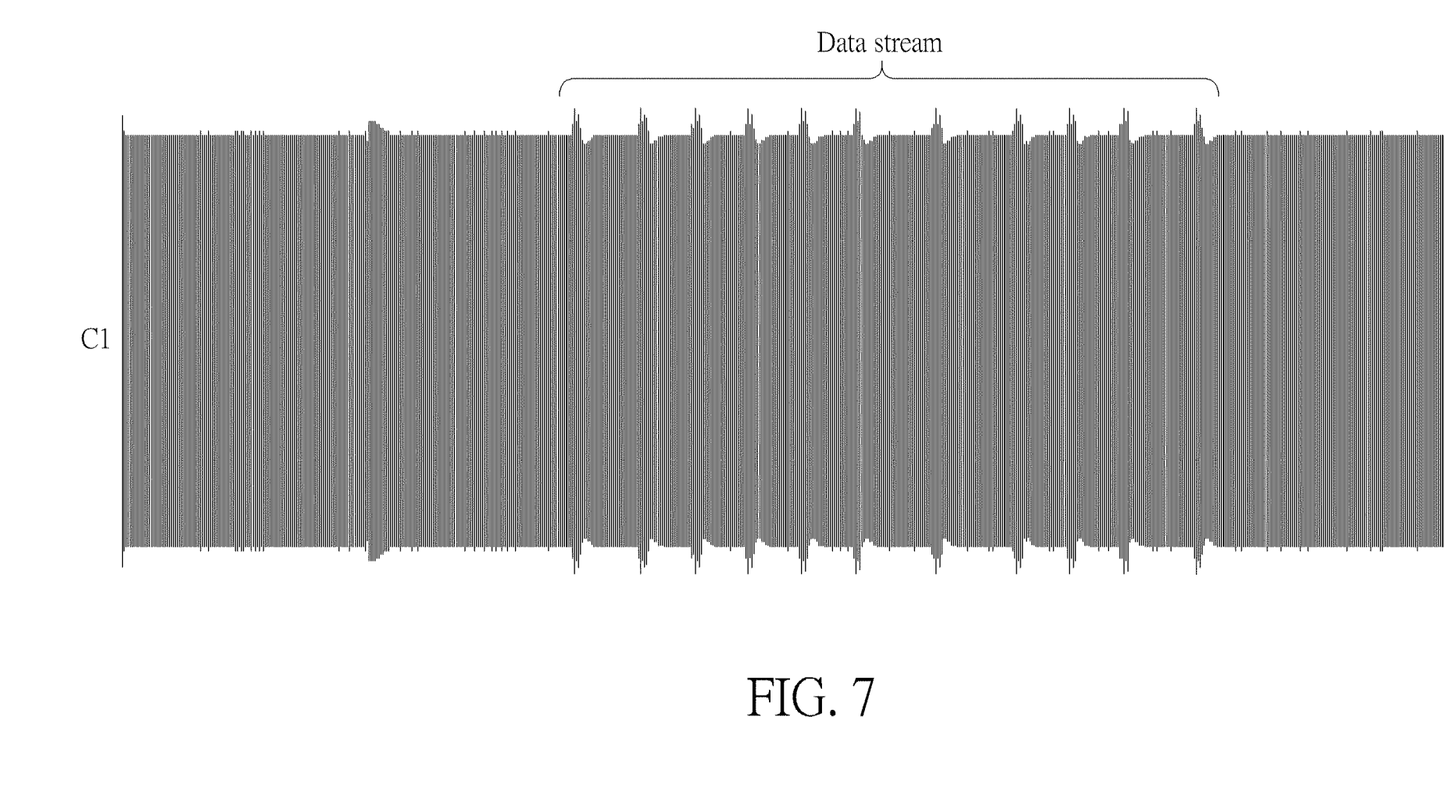
FIG. 7 is a waveform diagram of the coil signal carrying an entire data stream according to an embodiment of the present invention.

Therefore, transmission of each entire data stream (having a byte of data, a start bit and a parity check code) includes 11 jitters, as shown in FIG. 7. FIG. 7 illustrates the waveform of the coil signal C1 carrying an entire data stream, where these jitters may be recorded in at least 11 different time slots (and their adjacent time slots) after analysis and setting, in order to generate 10 data of time slot gaps. The processor 111 then determines the values of the data codes accordingly, and determines whether the data codes are accurate through the parity check code.

Please note that the present invention aims at providing a data decoding method applicable to the induction type power supply system, for performing decoding on the modulation data carried on the coil signal. Those skilled in the art may make modifications and alternations accordingly. For example, the abovementioned coding method is one of various embodiments, and the decoding method of the present invention may be used for different data code structures. For example, different time lengths may be applied to define the coding scheme, or an entire data stream may be configured to transmit multiple bytes of data codes, which should not be limited herein. In addition, the decoding method of the present invention may be applied in various data transmission systems with coding based on time length, which is not limited to the transmission of modulation data in the above induction type power supply system. In addition, those skilled in the art should understand that settings of the abovementioned values, bit values, numbering, etc. are only several examples among various implementations of the present invention, and the defined number may be adjusted according to system requirements.

To sum up, the present invention provides a decoding method for a signal processing circuit of an induction type power supply system, for performing decoding on the modulation data received by the supplying-end module. The modulation data/signal received by the supplying-end module may generate a jitter on the supplying-end coil, to generate a trigger gap during the detection process of the comparator module. According to the consecutive number of trigger gaps, the gap indicating signals may be generated. The processor then determines whether the gap indicating signals are scattered in a period, to ensure that the gap is generated from the jitters of the modulation signal. This in turn defines a jitter signal by setting the flag, to fill the value "1" in the corresponding time slot of the jitter signal queue buffer. Subsequently, the processor may fetch the positions or numbers of time slots filled with "1"s, and determine the bit values of data codes based on the gaps of these time slots. By using the multilevel decoding method of the present invention, the accurate modulation data may be effectively obtained even if there exist interferences of power noises.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A decoding method for a signal processing circuit, the signal processing circuit receiving a modulation data carried by a coil signal, the decoding method comprising:
   receiving the coil signal and determining a jitter in the coil signal;
   obtaining a trigger gap when the jitter appears in a peak location of a plurality of peaks in the coil signal;
   determining a length of the trigger gap, and outputting a gap indicating signal when the length of the trigger gap is within a predefined range;
   determining whether a plurality of gap indicating signals appear in a first period, and determining whether the plurality of gap indicating signals are scattered in the first period;
   setting a flag to a jitter status according to determination results of whether the plurality of gap indicating signals appear in the first period and whether the plurality of gap indicating signals are scattered in the first period;
   determining whether the flag is set to the jitter status during a second period, and accordingly filling a value in a time slot corresponding to the second period among a plurality of time slots for determining the modulation data; and
   obtaining a data code of the modulation data according to a plurality of values filled in the plurality of time slots.

2. The decoding method of claim 1, wherein the steps of receiving the coil signal and determining the jitter in the coil signal and obtaining the trigger gap when the jitter appears in the peak location of the plurality of peaks in the coil signal comprise:
   setting a peak voltage level for tracking peak voltages of the plurality of peaks;
   decreasing the peak voltage level by a predetermined value to obtain a determination voltage level;
   comparing the determination voltage level with the coil signal; and
   determining that the trigger gap appears when the peak voltage of a peak among the plurality of peaks smaller than the determination voltage level is detected.

3. The decoding method of claim 1, wherein the first period is divided into a first sub-period and a second sub-period, and the step of determining whether the plurality of gap indicating signals are scattered in the first period comprises:
   determining whether at least one of the plurality of gap indicating signals appears in the first sub-period;
   determining whether at least one of the plurality of gap indicating signals appears in the second sub-period; and
   determining that the plurality of gap indicating signals are scattered in the first period when the plurality of gap indicating signals appear in both of the first sub-period and the second sub-period.

4. The decoding method of claim 1, wherein the step of setting the flag to the jitter status according to the determination results of whether the plurality of gap indicating signals appear in the first period and whether the plurality of gap indicating signals are scattered in the first period comprises:
setting the flag to the jitter status when the gap indicating signals appear in the first period and the gap indicating signals are scattered in the first period.

5. The decoding method of claim 1, wherein the step of determining whether the flag is set to the jitter status during the second period and accordingly filling the value in the time slot corresponding to the second period among the plurality of time slots for determining the modulation data comprises:
filling a first value in the time slot corresponding to the second period when the flag is set to the jitter status; and
filling a second value in the time slot corresponding to the second period when the flag is not set to the jitter status.

6. The decoding method of claim 5, wherein the step of obtaining the data code of the modulation data according to the plurality of values filled in the plurality of time slots comprises:
fetching a first time slot filled with the first value and a second time slot filled with the next first value among the plurality of time slots;
calculating a gap between the first time slot and the second time slot to determine whether the gap complies with a bit length of the data code; and
obtaining the data code according to a length of the gap.

7. The decoding method of claim 6, further comprising:
determining at least one of a start bit and a parity check code of the modulation data according to the gap.

8. The decoding method of claim 7, further comprising:
obtaining the start bit, a byte of data codes and the parity check code of the modulation data during a third period.

9. The decoding method of claim 8, wherein the third period is equal to 50 milliseconds and the second period is equal to 0.25 milliseconds.

10. The decoding method of claim 1, further comprising:
clearing the setting of the flag at the end of the second period when the flag is set to the jitter status.

11. A signal processing circuit for receiving a modulation data carried by a coil signal and decoding the modulation data, the signal processing circuit comprising:
at least one comparator module, for receiving the coil signal and determining a jitter in the coil signal; and
a processor, coupled to the comparator module, configured to perform the following steps:
obtaining a trigger gap when the jitter appears in a peak location of a plurality of peaks in the coil signal;
determining a length of the trigger gap, and outputting a gap indicating signal when the length of the trigger gap is within a predefined range;
determining whether a plurality of gap indicating signals appear in a first period, and determining whether the plurality of gap indicating signals are scattered in the first period;
setting a flag to a jitter status according to determination results of whether the plurality of gap indicating signals appear in the first period and whether the plurality of gap indicating signals are scattered in the first period;
determining whether the flag is set to the jitter status during a second period, and accordingly filling a value in a time slot corresponding to the second period among a plurality of time slots for determining the modulation data; and
obtaining a data code of the modulation data according to a plurality of values filled in the plurality of time slots.

12. The signal processing circuit of claim 11, wherein the comparator module comprises a first comparator module and a second comparator module, wherein the first comparator module, the second comparator module and the processor perform the following steps to receive the coil signal and determine the jitter of the coil signal in order to obtain the trigger gap when the jitter appears in the peak location of the plurality of peaks in the coil signal:
setting, by the processor, a peak voltage level, allowing the first comparator module to track peak voltages of the plurality of peaks;
decreasing, by the processor, the peak voltage level by a predetermined value to obtain a determination voltage level;
comparing, by the second comparator module, the determination voltage level with the coil signal; and
determining, by the processor, the trigger gap appears when the second comparator module detects that the peak voltage of a peak among the plurality of peaks is smaller than the determination voltage level.

13. The signal processing circuit of claim 11, wherein the first period is divided into a first sub-period and a second sub-period, and the processor performs the following steps to determine whether the plurality of gap indicating signals are scattered in the first period:
determining whether at least one of the plurality of gap indicating signals appears in the first sub-period;
determining whether at least one of the plurality of gap indicating signals appears in the second sub-period; and
determining that the plurality of gap indicating signals are scattered in the first period when the plurality of gap indicating signals appear in both of the first sub-period and the second sub-period.

14. The signal processing circuit of claim 11, wherein the processor perform the following step to set the flag to the jitter status according to the determination results of whether the plurality of gap indicating signals appear in the first period and whether the plurality of gap indicating signals are scattered in the first period:
setting the flag to the jitter status when the gap indicating signals appear in the first period and the gap indicating signals are scattered in the first period.

15. The signal processing circuit of claim 11, wherein the processor performs the following steps to determine whether the flag is set to the jitter status during the second period and accordingly fill the value in the time slot corresponding to the second period among the plurality of time slots for determining the modulation data:
filling a first value in the time slot corresponding to the second period when the flag is set to the jitter status; and
filling a second value in the time slot corresponding to the second period when the flag is not set to the jitter status.

16. The signal processing circuit of claim 15, wherein the processor performs the following steps to obtain the data code of the modulation data according to the plurality of values filled in the plurality of time slots:
fetching a first time slot filled with the first value and a second time slot filled with the next first value among the plurality of time slots;

calculating an gap between the first time slot and the second time slot to determine whether the gap complies with a bit length of the data code; and obtaining the data code according to a length of the gap.

17. The signal processing circuit of claim 16, wherein the processor is further configured to perform the following step:

determining at least one of a start bit and a parity check code of the modulation data according to the gap.

18. The signal processing circuit of claim 17, wherein the processor is further configured to perform the following step:

obtaining the start bit, a byte of data codes and the parity check code of the modulation data during a third period.

19. The signal processing circuit of claim 18, wherein the third period is equal to 50 milliseconds and the second period is equal to 0.25 milliseconds.

20. The signal processing circuit of claim 11, wherein the processor further performs the following step:

clearing the setting of the flag at the end of the second period when the flag is set to the jitter status.

* * * * *

UNITED STATES PATENT AND TRADEMARK OFFICE
CERTIFICATE OF CORRECTION

PATENT NO. : 10,574,095 B2
APPLICATION NO. : 16/241940
DATED : February 25, 2020
INVENTOR(S) : Ming-Chiu Tsai et al.

Page 1 of 1

It is certified that error appears in the above-identified patent and that said Letters Patent is hereby corrected as shown below:

On the Title Page

Item (30), Foreign Application Priority Data insert:
--Aug. 30, 2018 (TW)............107130369A--

Signed and Sealed this
Twenty-third Day of June, 2020

Andrei Iancu
*Director of the United States Patent and Trademark Office*